(12) United States Patent
Su et al.

(10) Patent No.: US 12,139,398 B2
(45) Date of Patent: Nov. 12, 2024

(54) PRESSURE SENSOR WITH HIGH STABILITY

(71) Applicant: InvenSense, Inc., San Jose, CA (US)

(72) Inventors: Weng Shen Su, Hsinchu (TW); CHung-Hsien Lin, Hsinchu (TW); Yaoching Wang, San Jose, CA (US); Tsung Lin Tang, Kaohsiung (TW); Ting-Yuan Liu, Zhubei (TW); Calin Miclaus, Fremont, CA (US)

(73) Assignee: InvenSense, Inc., San Jose, CA (US)

( * ) Notice: Subject to any disclaimer, the term of this patent is extended or adjusted under 35 U.S.C. 154(b) by 322 days.

(21) Appl. No.: 17/950,007

(22) Filed: Sep. 21, 2022

(65) Prior Publication Data

US 2023/0089813 A1 Mar. 23, 2023

Related U.S. Application Data

(63) Continuation-in-part of application No. 17/899,395, filed on Aug. 30, 2022.

(Continued)

(51) Int. Cl.
*B81B 3/00* (2006.01)
*B81C 1/00* (2006.01)
*G01L 9/00* (2006.01)

(52) U.S. Cl.
CPC ........ *B81C 1/00158* (2013.01); *B81B 3/0021* (2013.01); *G01L 9/0073* (2013.01); *B81B 2201/0264* (2013.01); *B81B 2203/0127* (2013.01); *B81B 2203/04* (2013.01); *B81C 2201/0132* (2013.01); *B81C 2201/016* (2013.01); *B81C 2203/036* (2013.01)

(58) Field of Classification Search
CPC ........ B81C 1/00158; B81C 2201/0132; B81C 2201/016; B81C 2203/036; B81C 1/00182; B81B 3/0021; B81B 2201/0264; B81B 2203/0127; B81B 2203/04; G01L 9/0073; G01L 9/0042
See application file for complete search history.

(56) References Cited

U.S. PATENT DOCUMENTS 5,955,659 A * 9/1999 Gupta .................... G01N 11/00
361/283.4
6,109,113 A * 8/2000 Chavan .................. G01L 9/0073
73/706

(Continued)

*Primary Examiner* — David J Bolduc

(57) ABSTRACT

A method includes depositing a passivation layer on a substrate; depositing and patterning a first polysilicon layer on the passivation layer; depositing and patterning a first oxide layer on the first polysilicon layer forming a patterned first oxide layer; depositing and patterning a second polysilicon layer on the patterned first oxide layer. A portion of the second polysilicon layer directly contacts a portion of the first polysilicon layer. A portion of the patterned second polysilicon layer corresponds to a bottom electrode. A second oxide layer is deposited on the patterned second polysilicon layer and on an exposed portion of the patterned first oxide layer. A portion of the second oxide layer corresponding to a sensing cavity is etched, exposing the bottom electrode. Another substrate is bonded to the second oxide layer enclosing the sensing cavity. A top electrode is disposed within the another substrate and positioned over the bottom electrode.

27 Claims, 14 Drawing Sheets

Related U.S. Application Data

(60) Provisional application No. 63/247,625, filed on Sep. 23, 2021, provisional application No. 63/246,683, filed on Sep. 21, 2021.

(56) References Cited

U.S. PATENT DOCUMENTS

| | | | | |
|---|---|---|---|---|
| 6,352,874 B1* | 3/2002 | McNeil | G01L 9/0073 | 438/251 |
| 6,388,299 B1* | 5/2002 | Kang | G01L 9/0073 | 257/419 |
| 6,945,115 B1* | 9/2005 | Wang | G01L 9/0073 | 73/718 |
| 11,027,967 B2* | 6/2021 | Lin | G01L 9/0045 | |
| 11,885,705 B2* | 1/2024 | Kollias | G01L 9/125 | |
| 2002/0157475 A1* | 10/2002 | Onose | G01L 9/0042 | 73/754 |
| 2003/0015040 A1* | 1/2003 | Ishio | G01L 9/0042 | 73/718 |
| 2003/0019299 A1* | 1/2003 | Horie | G01L 9/0073 | 73/718 |
| 2003/0215974 A1* | 11/2003 | Kawasaki | B81C 1/00047 | 438/53 |
| 2004/0020303 A1* | 2/2004 | Blomberg | G01L 9/0073 | 73/718 |
| 2004/0232503 A1* | 11/2004 | Sato | G01L 9/0042 | 257/417 |
| 2005/0029607 A1* | 2/2005 | Fischer | G01L 9/0073 | 257/414 |
| 2005/0132814 A1* | 6/2005 | Satou | B81C 1/00293 | 73/715 |
| 2010/0050776 A1* | 3/2010 | Fuhrmann | G01L 9/0073 | 73/718 |
| 2011/0140215 A1* | 6/2011 | Sato | G01L 9/0042 | 257/419 |
| 2013/0020718 A1* | 1/2013 | Chou | H01L 24/81 | 257/774 |
| 2013/0334620 A1* | 12/2013 | Chu | B81C 1/00238 | 438/51 |
| 2014/0103461 A1* | 4/2014 | Chu | B81C 1/00238 | 438/51 |
| 2016/0060103 A1* | 3/2016 | Hung | B81C 1/00238 | 438/51 |
| 2016/0297673 A1* | 10/2016 | Lagouge | G01P 15/0802 | |
| 2016/0305835 A1* | 10/2016 | Kollias | G01L 9/12 | |
| 2017/0081173 A1* | 3/2017 | Liu | B81C 1/00182 | |
| 2017/0339494 A1* | 11/2017 | Perletti | H04R 19/005 | |
| 2017/0341928 A1* | 11/2017 | Liu | H02N 1/008 | |
| 2020/0096336 A1* | 3/2020 | Cook | B81C 1/00166 | |
| 2020/0131028 A1* | 4/2020 | Cheng | B81C 1/00238 | |
| 2021/0354981 A1* | 11/2021 | Hermes | B81C 99/0045 | |
| 2021/0403315 A1* | 12/2021 | Artmann | B81B 3/007 | |
| 2023/0064114 A1* | 3/2023 | Ferrari | B81C 1/00476 | |

* cited by examiner

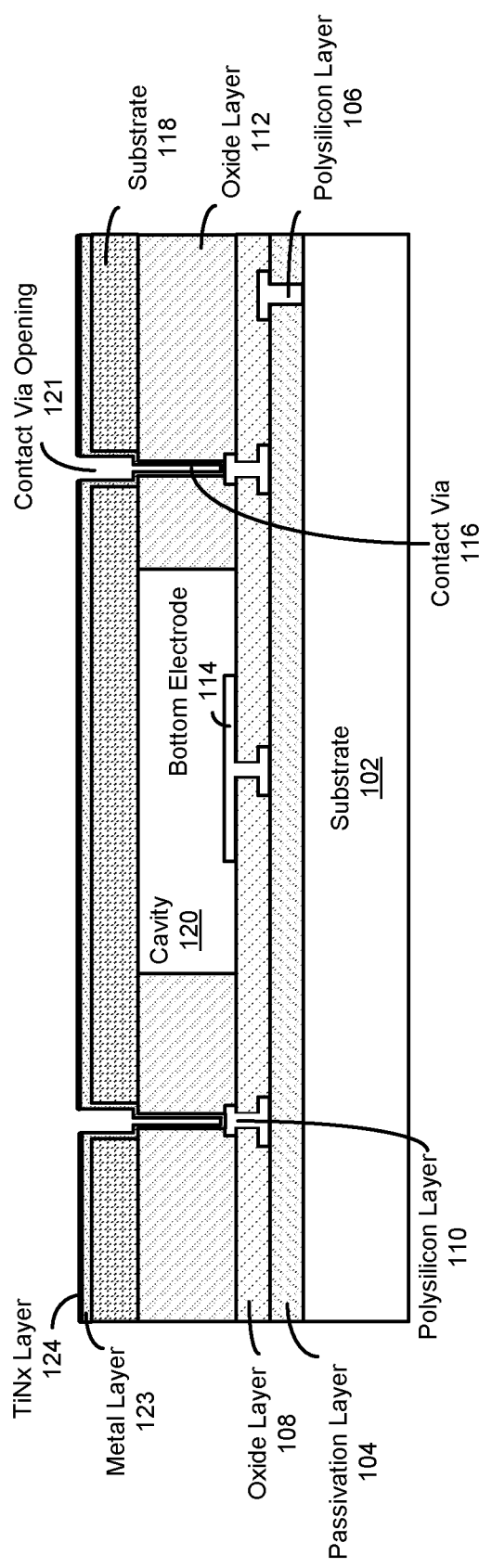
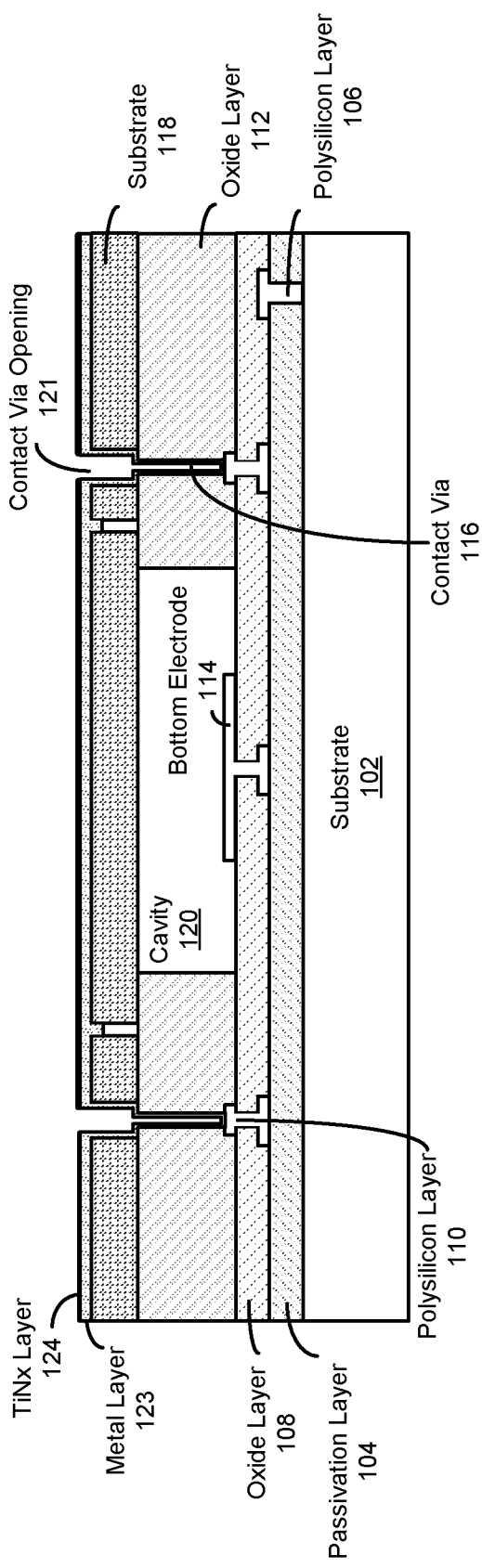
Figure 12A
Figure 12B

Forming a venting channel within the another substrate, wherein the venting channel exposes the second oxide layer
1991

Depositing a metal layer in the contact via and/or on the another substrate and on the venting channel to seal the venting channel
1992

Depositing a TiN$_x$ layer on the metal layer within the contact via
1994

Forming an isolation trench within the second oxide layer
1996

Depositing another passivation layer over the another substrate, the metal layer, and the isolation trench
1997

Removing a portion of the another passivation layer from the another substrate that corresponds to a diaphragm and further from a portion of the metal layer that corresponds to a bond pad
1998

Removing a TiN$_x$ that covers the bond pad
1999

Figure 19B

PRESSURE SENSOR WITH HIGH STABILITY

RELATED APPLICATIONS

The instant application is a non-provisional application and claims the benefit and priority to a provisional application No. 63/247,625 that was filed on Sep. 23, 2021, which is incorporated herein in its entirety. Moreover, this patent application is a continuation in part application and claims the benefit and priority to the patent application Ser. No. 17/899,395 that was filed on Aug. 30, 2022, which claims the benefit and priority to the provisional patent application No. 63/246,683 that was filed on Sep. 21, 2021, which are incorporated herein by reference in their entirety.

BACKGROUND

Stability is important for a high-performance pressure sensor. A high-performance pressure sensor may be used in extreme environments, e.g., extreme temperatures. The temperature coefficient (TCO) and mechanical stability is important for the high-performance pressure sensor. If the pressure sensor is not stable, it may provide wrong signal output.

Die size of pressure sensors have traditionally been large due to a large area that is required for the membrane of the pressure sensor. Unfortunately, temperature performance such as TCO becomes worst due to the large area of metal being used. Moreover, the metal layers also limit the annealing temperature to bake out gas from the cavity. It is appreciated that use of metal layers also results in poor temperature cycle testing (TCT) performance as well as other tests such as high-temperature operating life (HTOL) and high temperature storage (HTS), to name a few.

SUMMARY

Accordingly, a need has arisen for a new pressure sensor design, e.g., sensing membrane and electrodes, with high environment stability. Using polysilicon to form the sensing membrane, as well as electrode and routing, provides better TCO matching and higher thermal budget by using fewer metal layers, as an example. It is appreciated that in some embodiments, fewer metal layers, e.g., only one metal layer, are kept in the end of process for pad connection, thereby decreasing the amount of metal layer usage. Moreover, using polysilicon instead of metal for the electrodes achieves higher annealing because polysilicon does not melt, unlike metal during the bake out gassing process (to form vacuum in the cavity of the sensor). Melting of metal may result in disposition of the electrodes or the routing and may be known as a hillock effect. Use of polysilicon reduced the hillock effect. In addition, polysilicon membrane is thin thus providing better mechanical stability to prevent membrane stiction as well as reducing gravity sensitivity.

A method include depositing a passivation layer on a substrate; depositing and patterning a first polysilicon layer on the passivation layer; depositing and patterning a first oxide layer on the first polysilicon layer to form a patterned first oxide layer; depositing and patterning a second polysilicon layer on the patterned first oxide layer, wherein at least one portion of the second polysilicon layer directly contacts at least a portion of the first polysilicon layer, and wherein a portion of the patterned second polysilicon layer corresponds to a bottom electrode; depositing a second oxide layer on the patterned second polysilicon layer and further on an exposed portion of the patterned first oxide layer; etching a portion of the second oxide layer corresponding to a sensing cavity, wherein the etching exposes the bottom electrode; and fusion bonding another substrate to the second oxide layer to enclose the sensing cavity, wherein a top electrode is disposed within the another substrate and wherein the top electrode is positioned over the bottom electrode.

The passivation layer may be an oxide layer, e.g., high density plasma (HDP) oxide, polyethylene oxide, thermal oxide, etc. The first oxide layer may be an oxide, nitride, oxide layer. The first oxide layer may be an oxide, silicon nitride, oxide layer.

The method may further include removing a carrier substrate from the another substrate, wherein a portion of the another substrate remaining after the removing positioned over the bottom electrode forms a diaphragm of a sensor. According to some embodiments, the method further includes forming a contact via within the second oxide layer, wherein the channel exposes a portion of the patterned polysilicon layer. In one nonlimiting example, the method may further include depositing a metal layer in the contact via. In yet another nonlimiting example, the method may further include depositing a $TiN_x$ layer on the metal layer within the contact via. The method also includes forming an isolation trench within the second oxide layer. It is appreciated that in some nonlimiting examples the method further includes depositing another passivation layer over the another substrate, the metal layer, and the isolation trench. In yet some embodiments, the method may further include removing a portion of the another passivation layer from the another substrate that corresponds to a diaphragm and further removing a portion of the another passivation layer from a portion of the metal layer that corresponds to a bond pad. It is appreciated that in some embodiments, a $TiN_x$ that covers the bond pad is removed.

In some optional embodiments, the method further includes forming a venting channel within the another substrate, wherein the venting channel exposes the second oxide layer. In one nonlimiting example, the method further includes depositing a metal layer on the another substrate and further on the venting channel to seal the venting channel.

It is appreciated that in some embodiments, the metal layer comprises AlCu. In some nonlimiting examples, the method further includes depositing a $TiN_x$ layer on the metal layer. It is appreciated that in some embodiments, the metal layer is patterned. In some embodiments, the method further includes forming an isolation trench based on the patterning the metal to expose the second oxide layer. In some embodiments, the method further includes depositing another passivation layer over the another substrate, the patterned metal layer, and the isolation trench. In some nonlimiting examples, the method further includes removing a portion of the another passivation layer from the another substrate that corresponds to a diaphragm and further removing a portion of the another passivation layer from a portion of the metal layer that corresponds to a bond pad. According to some embodiments, the method further includes removing a $TiN_x$ that covers the bond pad.

According to some embodiments, a device includes a substrate; a passivation layer formed over the substrate; a first polysilicon layer formed on the passivation layer; a first oxide layer formed on the first polysilicon layer; a second polysilicon layer formed on the first oxide layer, wherein at least one portion of the second polysilicon layer directly contacts at least a portion of the first polysilicon layer, and wherein a portion of the patterned second polysilicon layer corresponds to a bottom electrode; a second oxide layer formed on the first oxide layer; and another substrate bonded to the second oxide layer, wherein the another substrate and a portion of the second oxide layer and the first oxide layer enclose a sensing cavity, wherein a portion of the another substrate forms a diaphragm of a sensor an comprises a top electrode that is positioned over the bottom electrode, and wherein a portion of the second oxide layer forms a sidewall of the enclosed sensing cavity.

In some embodiments, the device further includes a contact via opening formed within the another substrate and over the second oxide layer, wherein a metal layer is deposited on the contact via. In one nonlimiting example, a $TiN_x$ layer is deposited on the metal layer. According to some embodiments, a passivation layer is formed over the metal layer, e.g., $SiN_x$. The $SiN_x$ layer is formed directly on the $TiN_x$ layer in some nonlimiting examples.

In some optional embodiments, the device further includes a vent hole formed within the another substrate and over the second oxide layer. In some embodiments, a metal layer seals the vent hole. In some embodiments, a $TiN_x$ is formed over the metal layer. In yet some embodiments, an $SiN_x$ layer is formed over the metal layer. It is appreciated that the $SiN_x$ layer may be formed directly on a $TiN_x$ layer that is formed over the metal layer.

In some embodiments, the device further includes an isolation trench formed within another substrate and over the second oxide layer, wherein the isolation trench isolates a metal layer of a bond pad that is formed over the another substrate from other metal layers. It is appreciated that in some embodiments an $SiN_x$ layer is formed over the isolation trench.

These and other features and advantages will be apparent from a reading of the following detailed description.

BRIEF DESCRIPTION OF DRAWINGS

FIGS. 12A, 13A, 14A, 15A, 16A, 17A, and 18A show an example of a process to complete manufacturing of the pressure sensor in FIG. 11A according to one aspect of the present embodiments.

FIGS. 12B, 13B, 14B, 15B, 16B, 17B, and 18B show an example of a process to complete manufacturing of the pressure sensor in FIG. 11B according to one aspect of the present embodiments.

FIGS. 19A-19B show a flow diagram of an example of a process for manufacturing the pressure sensor according to one aspect of the present embodiments.

DESCRIPTION

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Figure 1:
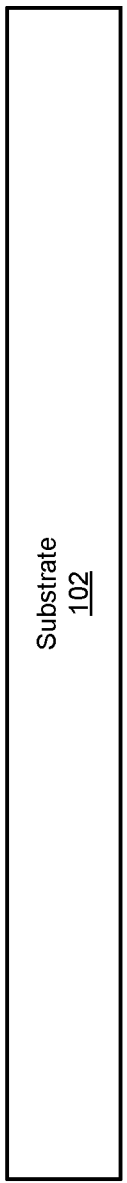
FIGS. 1-10 show an example of a detailed process for manufacturing a pressure sensor with polysilicon electrode and routings to improve temperature coefficient and mechanical stability according to one aspect of the present embodiments.

FIGS. 1-10 show an example of a detailed process for manufacturing a pressure sensor with polysilicon electrode and routings to improve temperature coefficient and mechanical stability according to one aspect of the present embodiments. Referring specifically to FIG. 1, a substrate 102 may be provided. The substrate may be a silicon substrate, e.g., n or p. In some embodiments, the top surface of the substrate 102 may include a p+ implantation.

Figure 2:
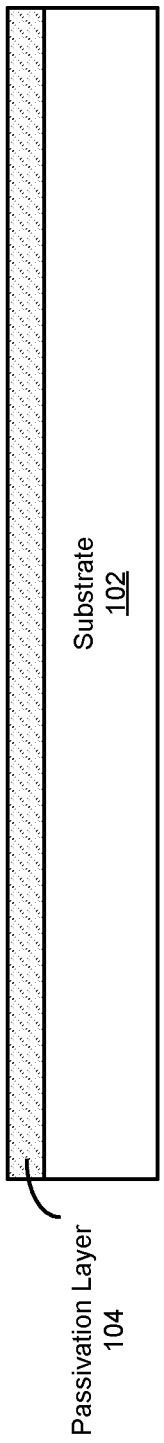
Figure 3:
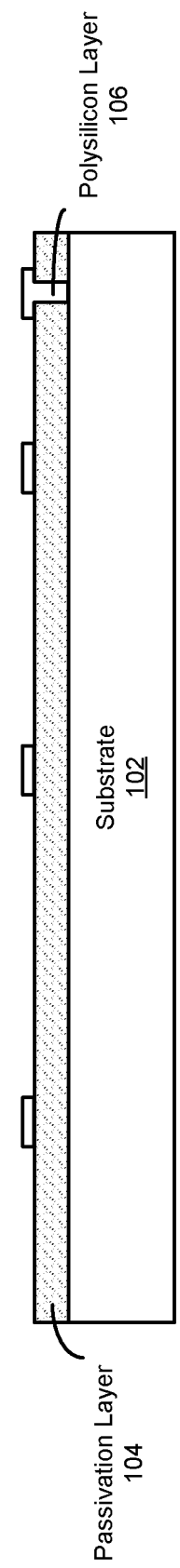

Referring now to FIG. 2, a passivation layer 104 is deposited over the top surface of the substrate 102. The passivation layer may be an oxide layer, e.g., high density plasma (HDP) oxide, polyethylene oxide, thermal oxide, etc. It is appreciated that in some embodiments, the passivation layer 104 may optionally be etched to expose the substrate 102 underneath (for forming the ground in later steps). Referring now to FIG. 3, a polysilicon layer 106 is deposited over the passivation layer 104 and further deposited in the etched portion of the passivation layer 104 to contact the substrate 102, forming the ground. The polysilicon layer 106 may include n-doped polysilicon layer or p-doped polysilicon layer. The polysilicon layer 106 may be patterned. It is appreciated that in some embodiments, the polysilicon layer 106 may be deposited, go through a chemically and mechanically planarized (CMP) process to fill in the vias.

Subsequently, another layer of polysilicon layer is deposited and annealed and further goes through an anneal process.

Figure 4:
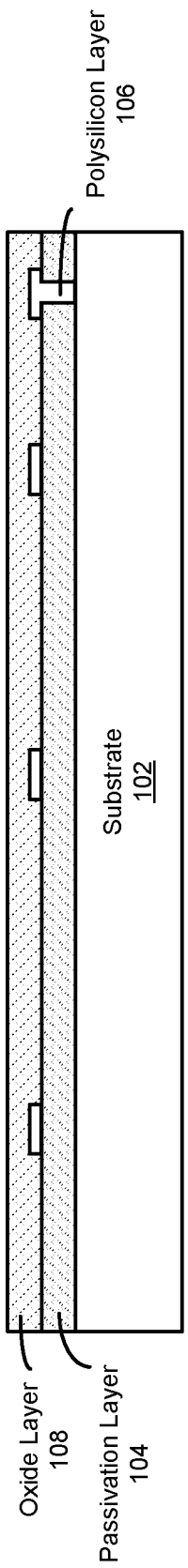

Referring now to FIG. 4, an oxide layer 108 is deposited over the polysilicon layer 106 and further on the exposed regions of the passivation layer 104. It is appreciated that the oxide layer 108 may include multiple layers, e.g., oxide/nitride/oxide, oxide/SiN$_x$/oxide, HDP oxide/SiN$_x$/HDP oxide, HDP oxide/SiN$_x$/oxide, oxide/SiN$_x$/HDP oxide, etc. In some embodiments, the oxide layer 108 goes through a CMP process. It is appreciated that the oxide layer 108 prevents outgassing from the substrate 102 to the cavity of the sensor (which is formed and described later).

Figure 5:
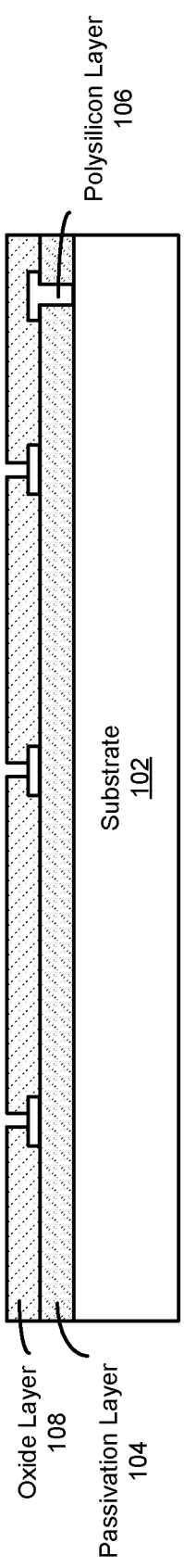

Referring now to FIG. 5, the oxide layer 108 is etched to form a poly via opening and expose certain portions of the polysilicon layer 106 that will be forming the bottom electrode (described later) and routings. It is appreciated that in some embodiments, a photoresist may be used and patterned to correspond to the poly via openings.

Figure 6:
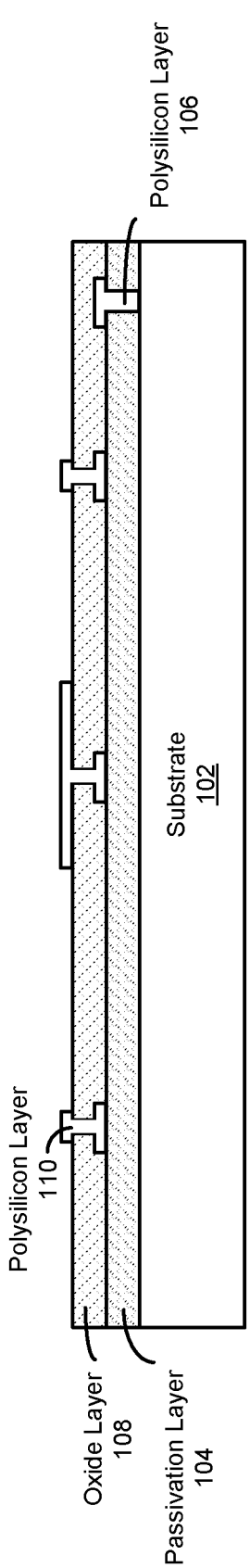

Referring now to FIG. 6, a polysilicon layer 110, which may be similar to that of polysilicon layer 106, is deposited over the oxide layer 108 and the poly vias with the exposed polysilicon layer 106 followed by an anneal process. The polysilicon layer 110 may be patterned, thereby forming the bottom electrode and routings (described later). It is appreciated that the polysilicon layer 110 deposition may go through a similar process, as described above in FIG. 3.

Figure 7:
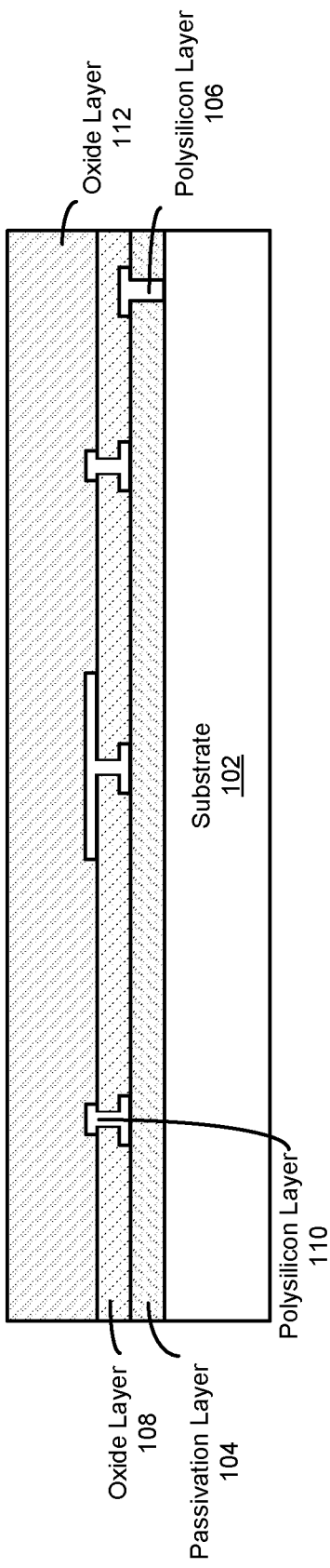

Referring now to FIG. 7, an oxide layer 112 is deposited over the polysilicon layer 110 and further on the oxide layer 108. It is appreciated that the oxide layer 112 may be used in the later process for bonding, e.g., fusion bonding, a substrate to the substrate 102. It is appreciated that the oxide layer 112 may be followed by the CMP process.

Figure 8:
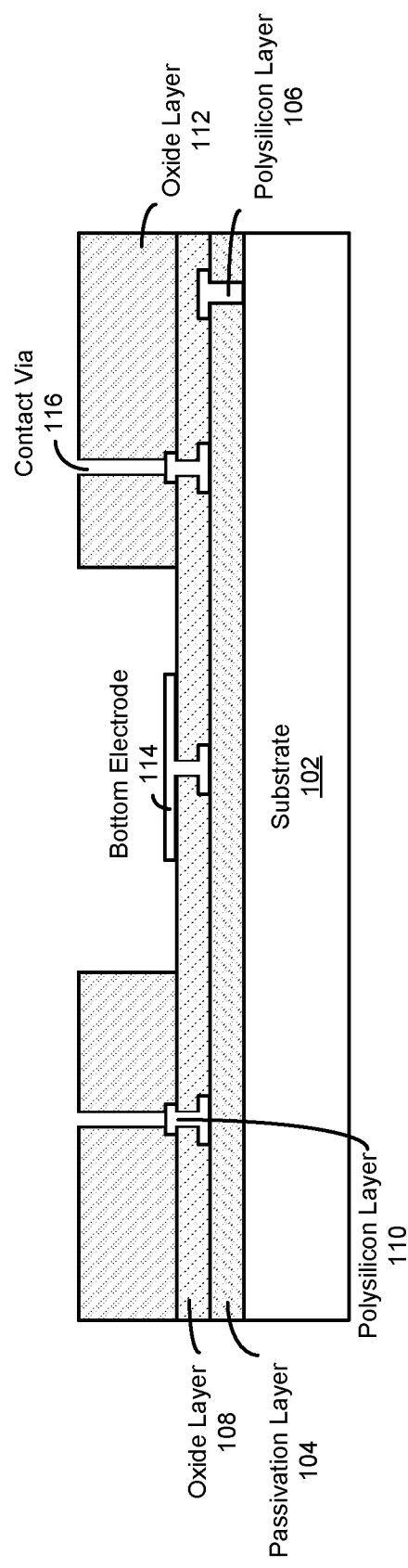

Referring now to FIG. 8, formation of the cavity and the contact vias is shown according to some embodiments. It is appreciated that the oxide layer 112 may be selectively etched to form a cavity and to expose the polysilicon layer 110 that forms the bottom electrode 114. Moreover, the oxide layer 112 may be etched to expose the contact vias 116.

Figure 9:
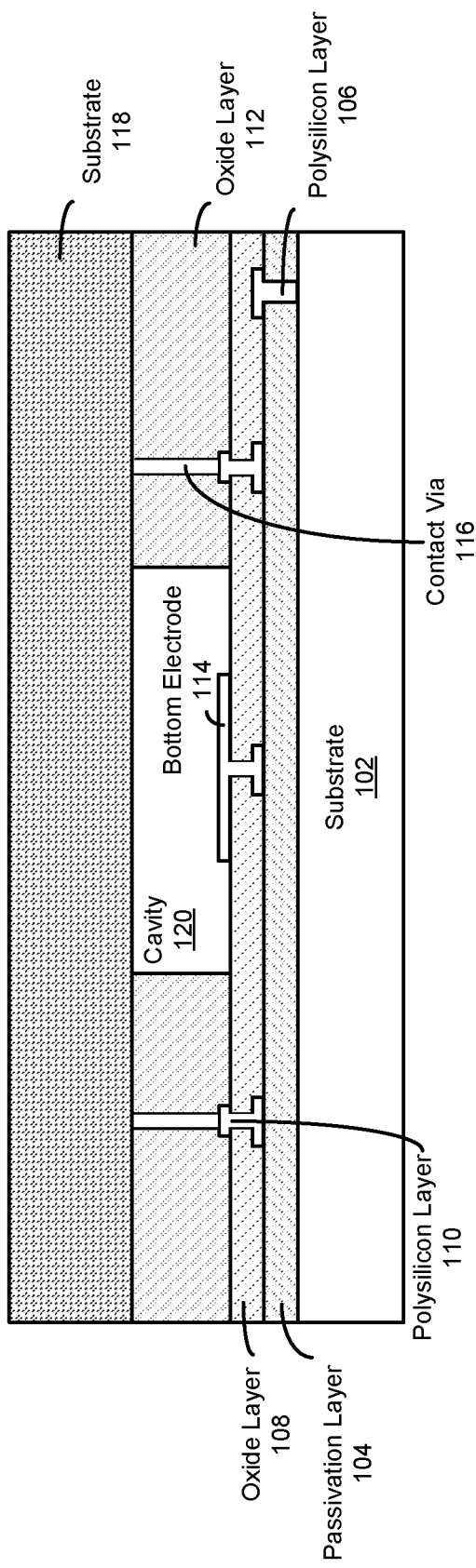
Figure 10:
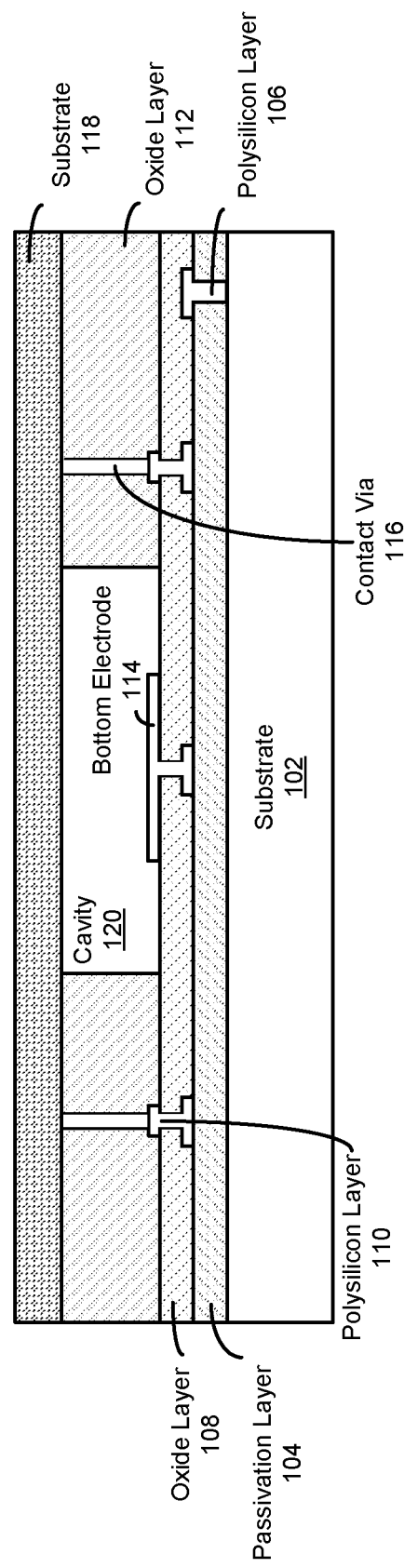

Referring now to FIG. 9, bonding a substrate 118 to the substrate 102 using the oxide layer 112 is shown. In some embodiments, the bonding of the substrate 118 may be a fusion bond. Bonding the substrate 118 to the substrate 102 encloses the cavity 120 and forms the sensing cavity of the sensor. In some nonlimiting examples the substrate 118 may be a silicon oxide substrate. Referring now to FIG. 10, the substrate 118 is thinned, e.g., grinding and dry etching, to remove the silicon carrier (carrier substrate). It is appreciated that the thinned substrate 118 positioned above the cavity 120 forms the deformable membrane (i.e., diaphragm) of the sensor.

Figure 11A:
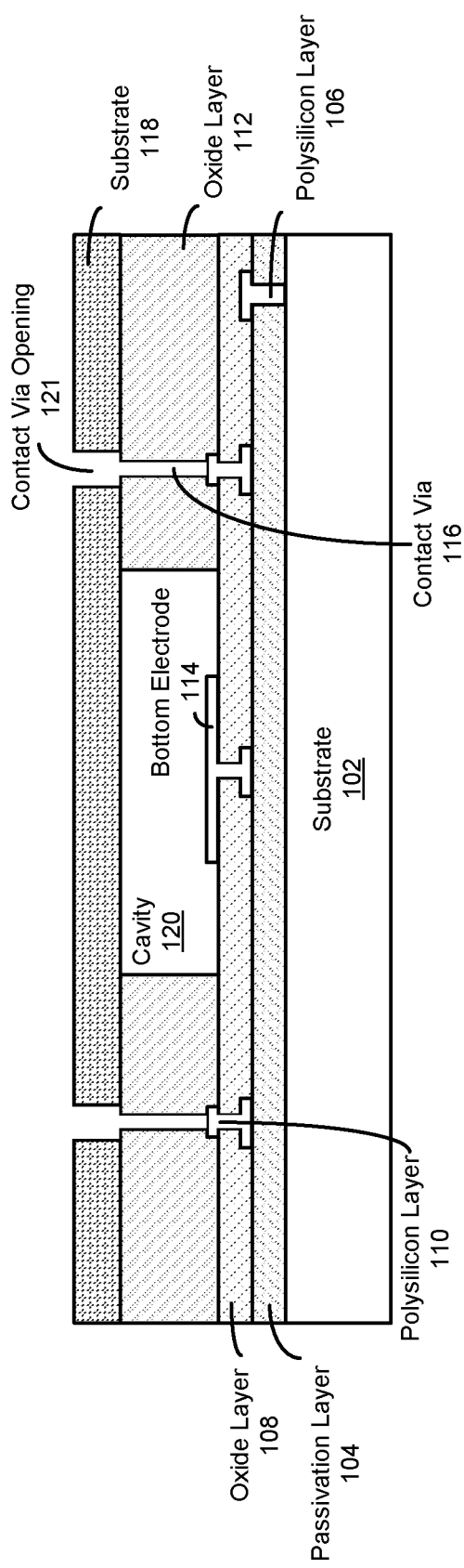
FIG. 11A shows an example of a process to open contact vias in the pressure sensor of FIG. 10 according to one aspect of the present embodiments.

Referring now to FIG. 11A, an example of a process to open contact vias 121 in the pressure sensor of FIG. 10 according to one aspect of the present embodiments. It is appreciated that in some embodiments, the substrate 118 may be selectively etched to open the contact vias 121.

Figure 11B:
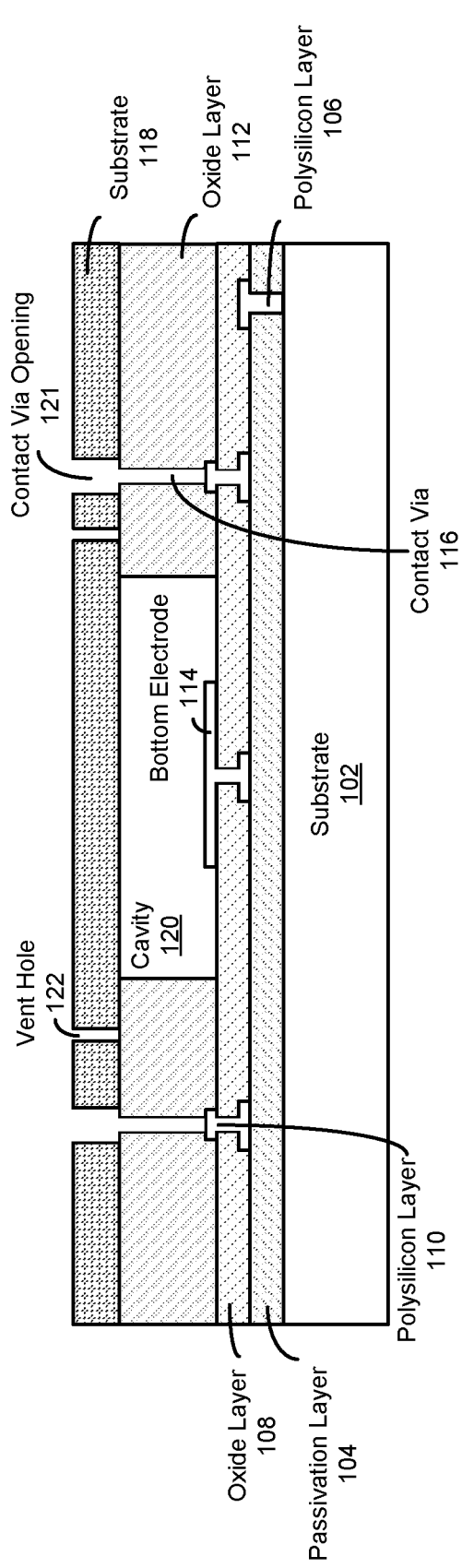
FIG. 11B shows an example of a process to form a vent hole in the pressure sensor of FIG. 11A according to one aspect of the present embodiments.

Referring now to FIG. 11B, an optional example of a process to form a vent hole 122 in the pressure sensor of FIG. 11A according to one aspect of the present embodiments. In some embodiments, the vent holes 122 are optionally formed within the substrate 118 to assist with outgassing from the cavity 120. It is appreciated that the need to use vent holes 122 is optional because unlike the conventional process, the embodiments use polysilicon layers to form the electrode(s) and the routing which therefore enables the process to use higher temperatures to remove gases at a higher rate.

FIGS. 12A, 13A, 14A, 15A, 16A, 17A, and 18A show an example of a process to complete manufacturing of the pressure sensor in FIG. 11A according to one aspect of the present embodiments. Referring specifically to FIG. 12A, a metal layer 123, e.g., TiN, AlCu, Ti, etc., is deposited over the substrate 118 as well as in the contact via openings 121. It is appreciated that in some embodiments, a layer of TiN$_x$ 124 may also be formed over the metal layer 123 if the metal layer 123 is a metal other than TiN. It is appreciated that the TiN$_x$ 124 layer is used to protect the metal layer 123 in subsequent processing steps (described later).

Figure 13A:
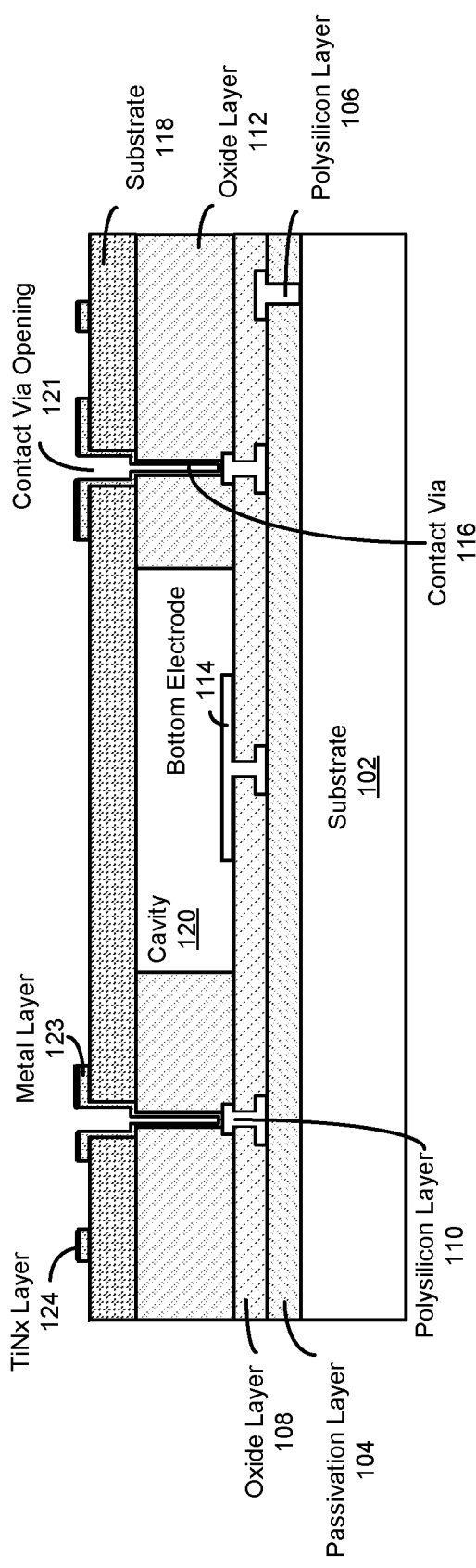
Figure 13B:
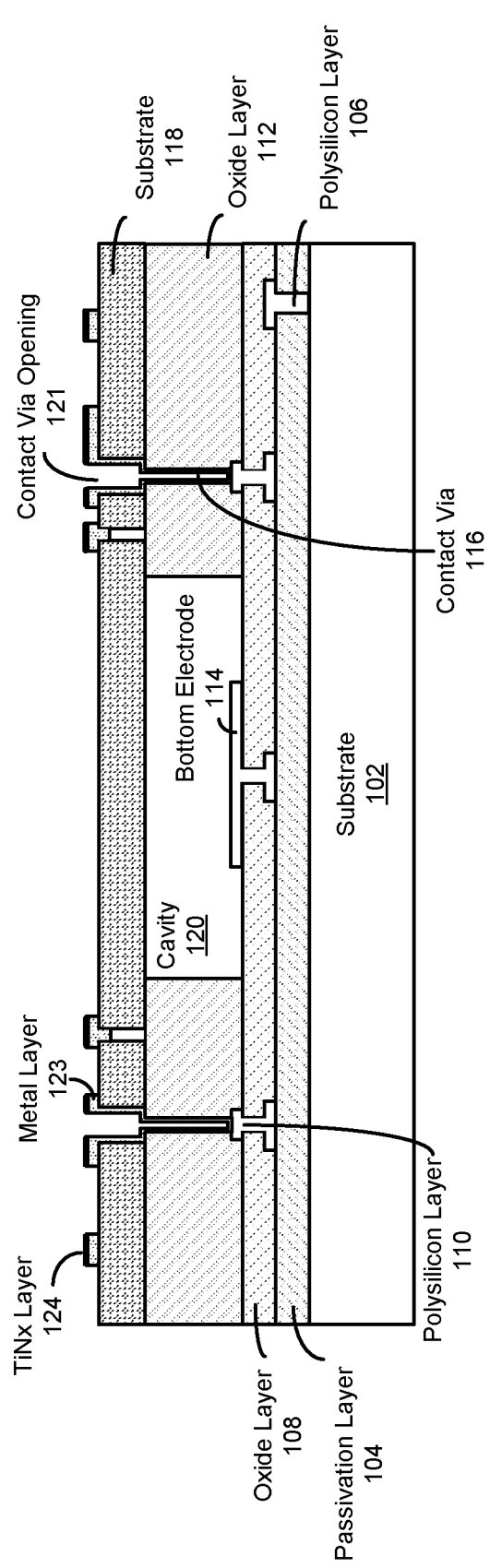
Figure 14A:
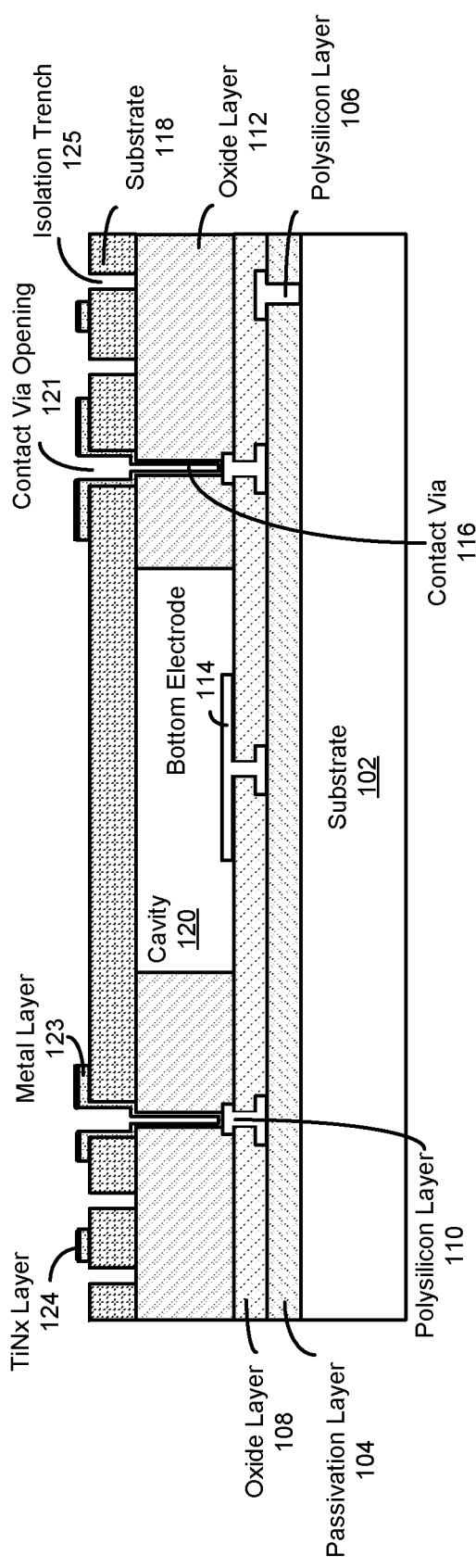
Figure 14B:
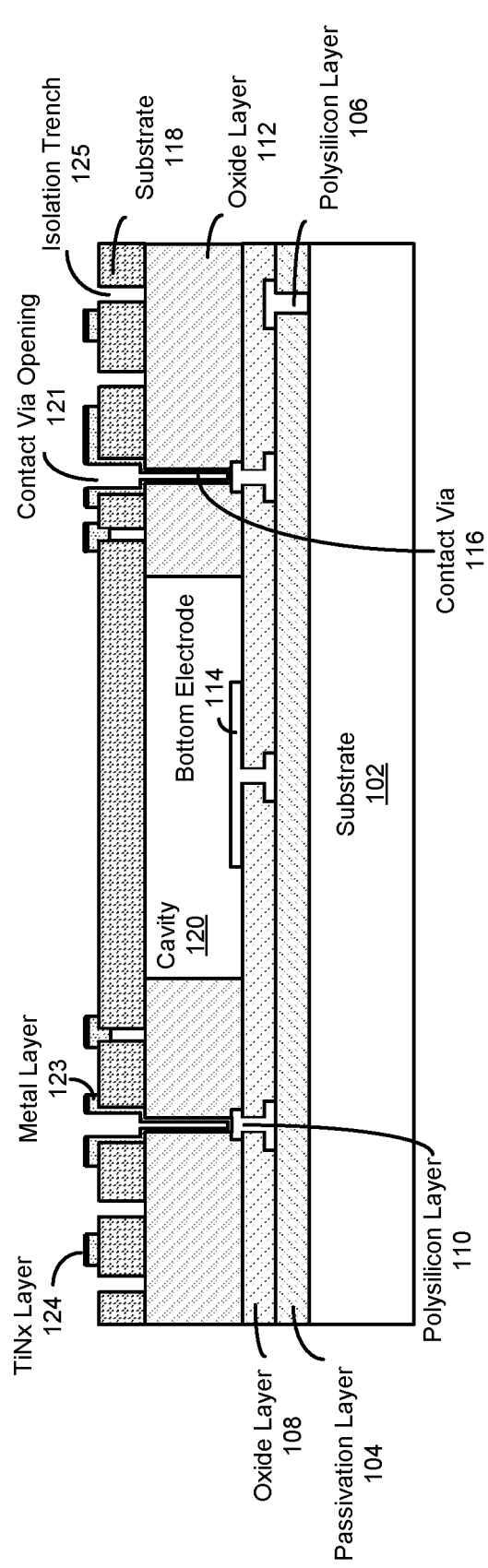

Referring now to FIG. 13A, the metal layer 123 and the TiN$_x$ layer 124 is patterned by dry etching, in one nonlimiting example, to correspond to isolation trench formation (that will be described later) to isolate the electrical connections. Referring now to FIG. 14A, isolation trenches 125 are formed within the substrate 118 through a dry etch process. It is appreciated that the isolation trenches 125 expose the oxide layer 112 underneath. Thus, different portions of the metal layer 123 are electrically isolated from one another due to formation of the isolation trenches 125.

Figure 15A:
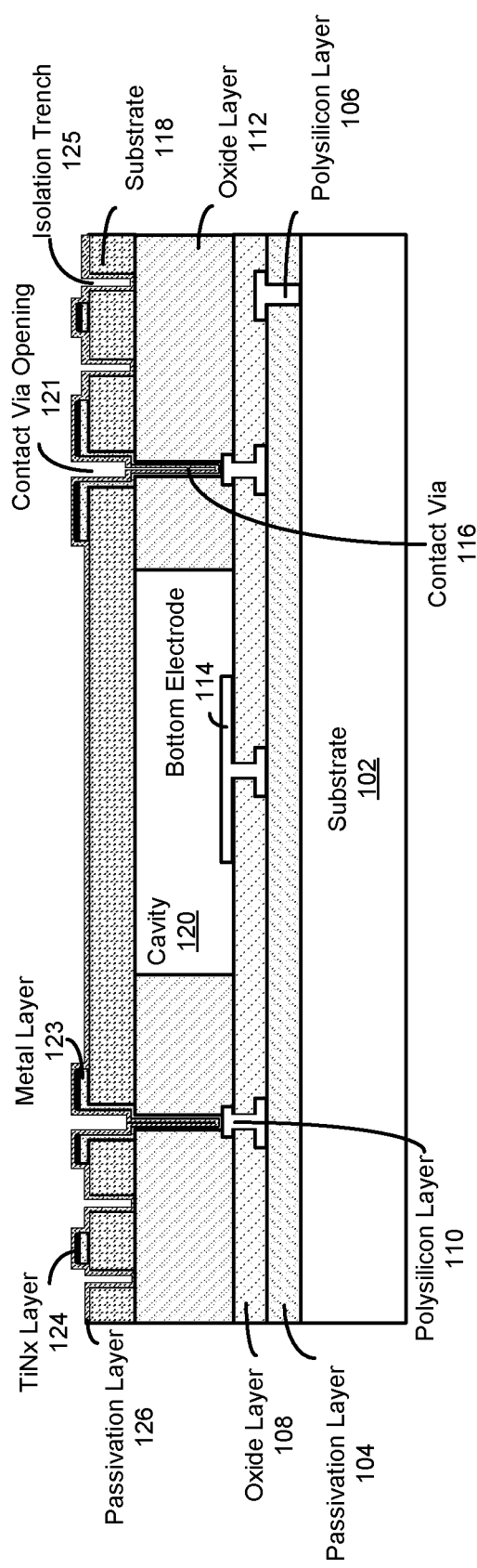
Figure 15B:
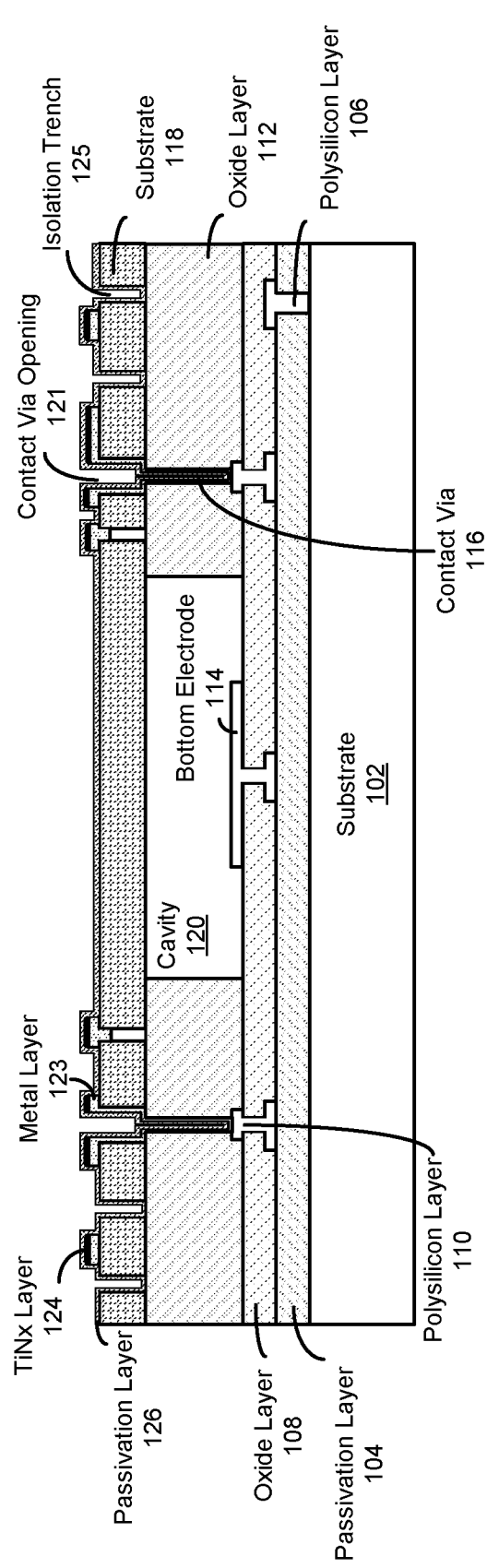
Figure 16A:
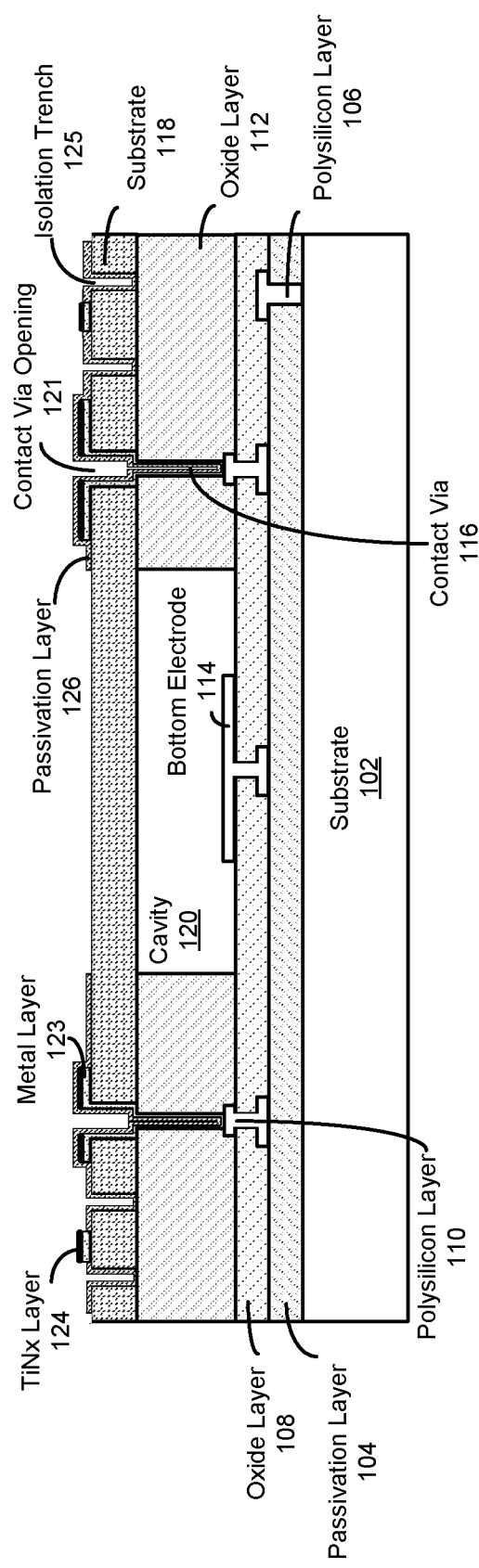
Figure 16B:
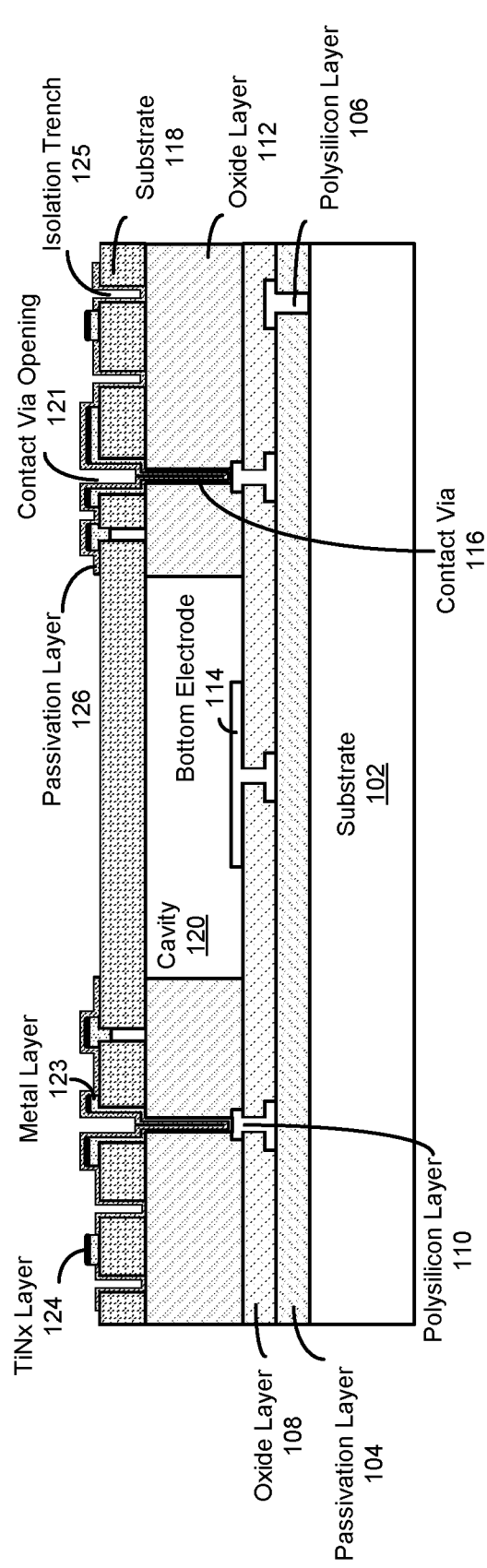
Figure 17A:
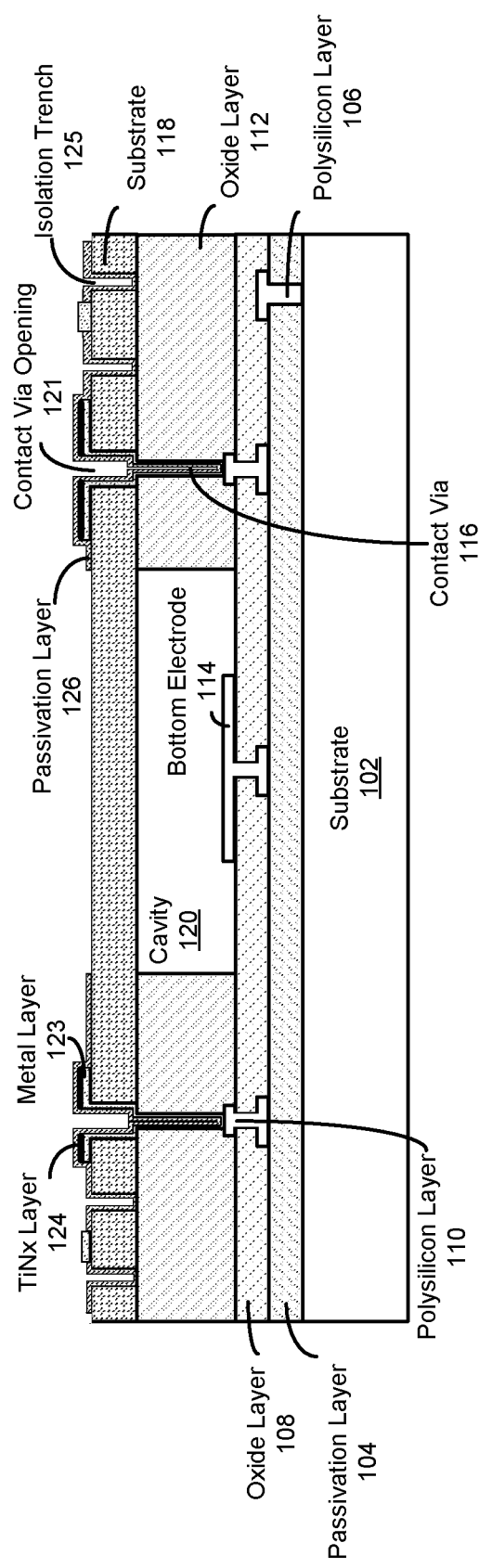
Figure 17B:
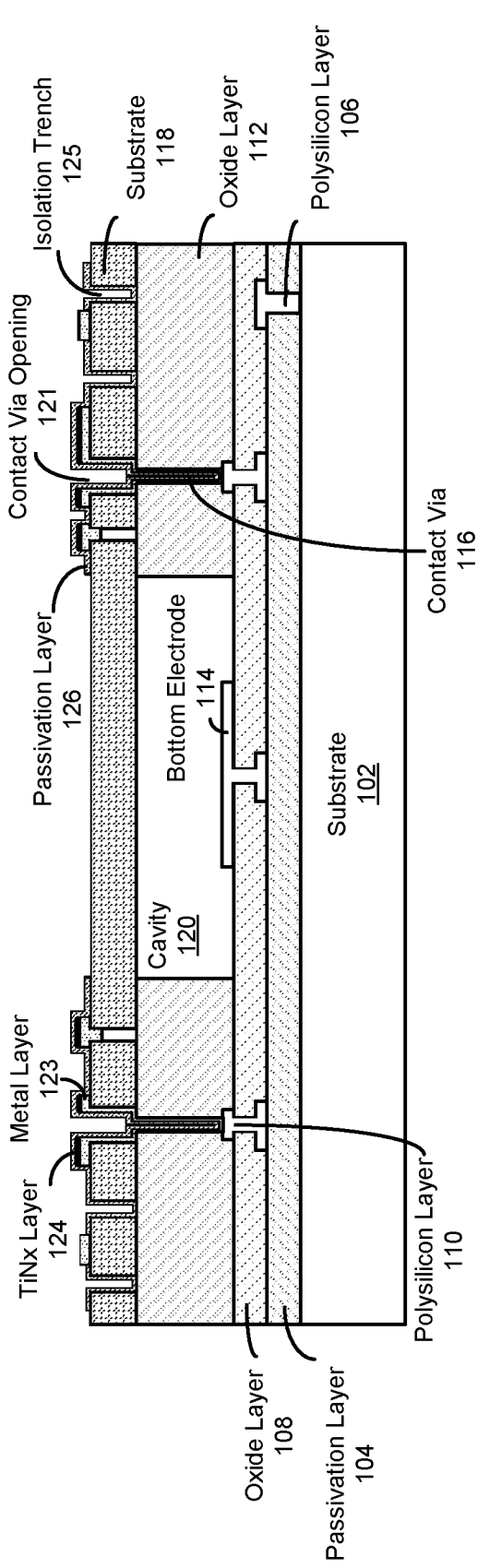
Figure 18A:
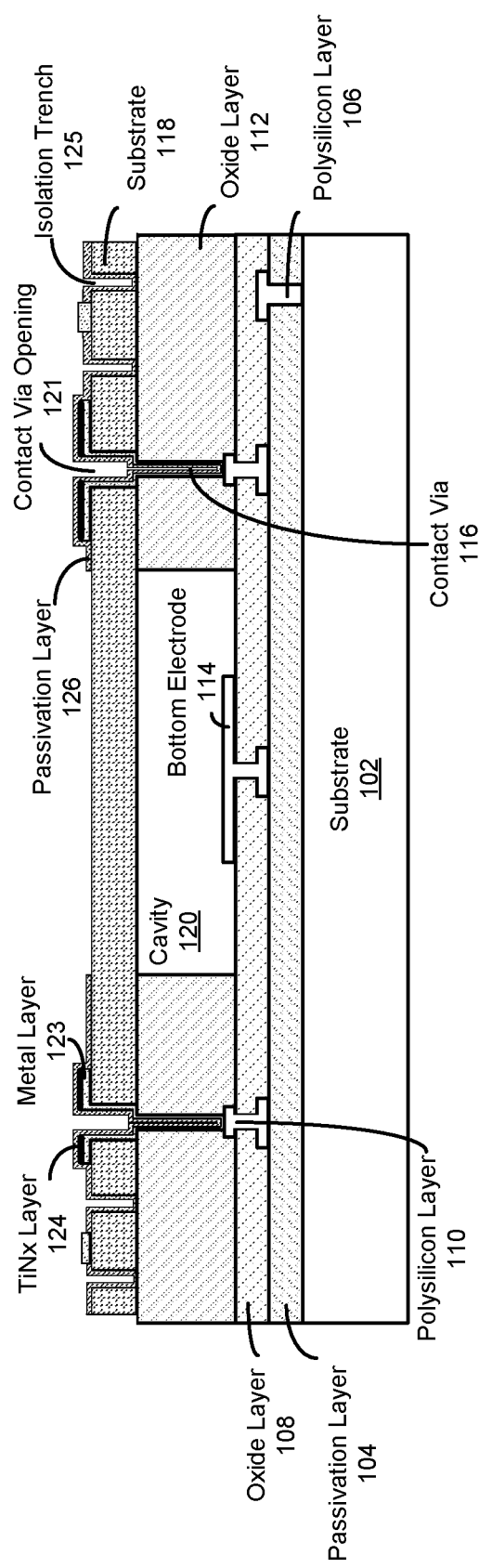
Figure 18B:
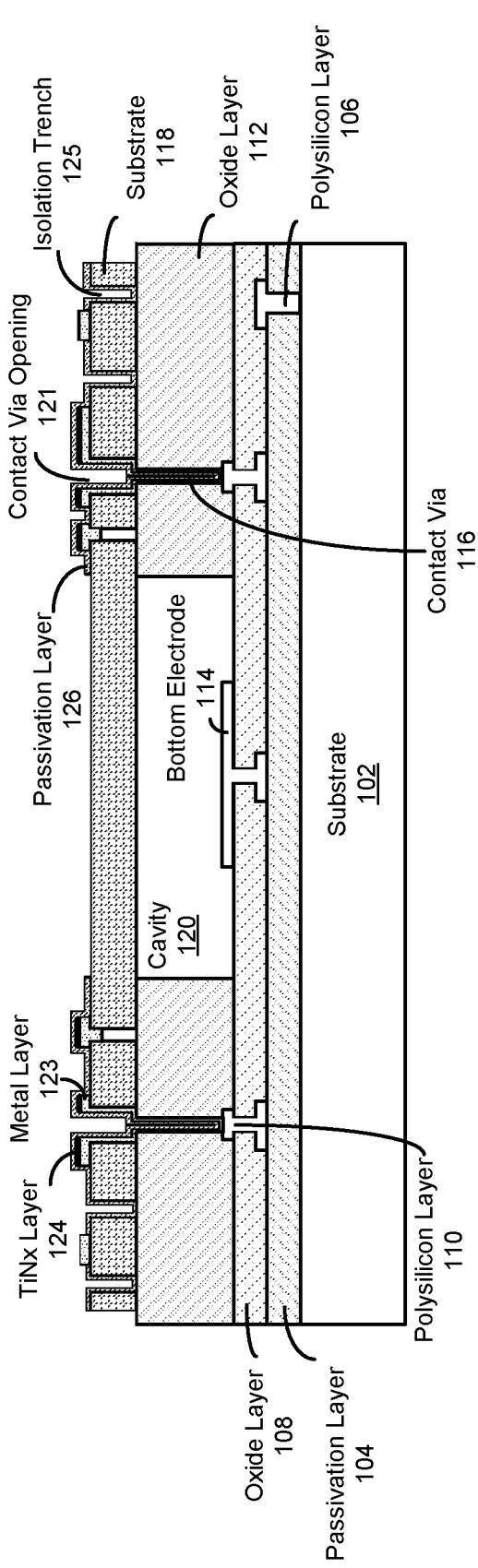

Referring now to FIG. 15A, a passivation layer 126, e.g., SiN$_x$, is formed over the exposed portions of the substrate 118, over the isolation trenches 125, and over the TiN$_x$ layer 124 covering the metal layer 123. Referring now to FIG. 16A, the passivation layer 126 is patterned to expose a portion of the substrate 118 that corresponds to the deformable membrane and also to the electrical contact. Referring now to FIG. 17A, the TiN$_x$ layer 124 that is not covered by the passivation layer 126 is removed to expose the metal layer 123 (i.e., exposing the bonding pad metal). Referring now to FIG. 18A, the silicon substrate 118 is etched for scribe lines according to some embodiments.

It is appreciated that FIGS. 12B, 13B, 14B, 15B, 16B, 17B, and 18B go through a similar process as FIGS. 12A, 13A, 14A, 15A, 16A, 17A, and 18A except that FIGS. 12B, 13B, 14B, 15B, 16B, 17B, and 18B include the vent holes 122 that are subsequently plugged with the metal layer 123.

Figure 19A:
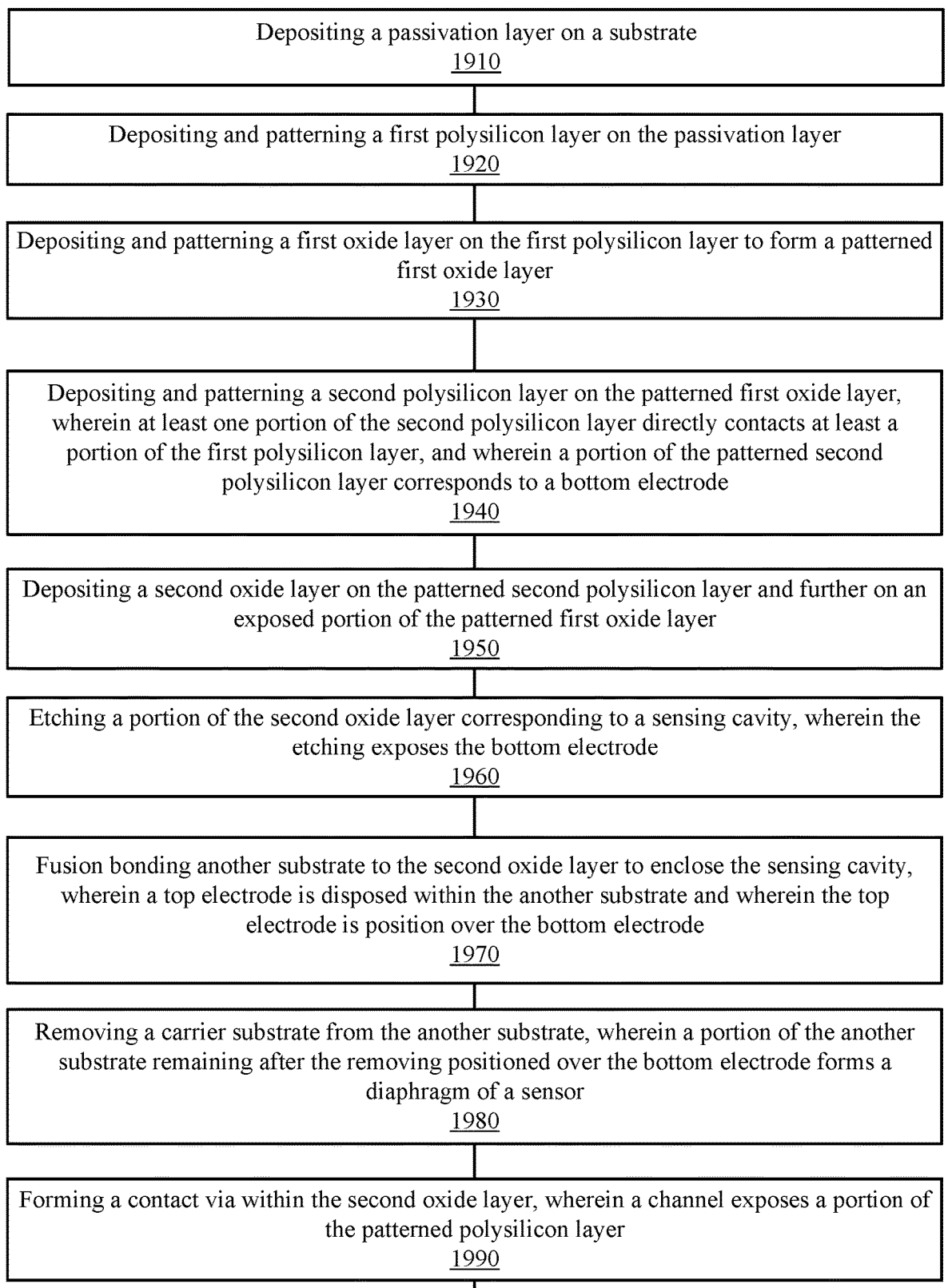

Referring now to FIGS. 19A-19B, a flow diagram of an example of a process for manufacturing the pressure sensor according to one aspect of the present embodiments is shown. At step 1910, a passivation layer is deposited on a substrate, as described above with respect to FIGS. 1 and 2. At step 1920, a first polysilicon layer is deposited on the passivation and patterned, as described above in FIG. 3. At step 1930, a first oxide layer is deposited on the first polysilicon layer and patterned to form a patterned first oxide layer, as described above in FIGS. 4 and 5. At step 1940, a second polysilicon layer is deposited on the patterned first oxide layer and patterned, as described in FIG. 6. At least one portion of the second polysilicon layer directly contacts at least a portion of the first polysilicon layer. A portion of the patterned second polysilicon layer corresponds to a bottom electrode. At step 1950, a second oxide layer is deposited on the patterned second polysilicon layer and further on an exposed portion of the patterned first oxide layer, as described in FIG. 7. At step 1960, a portion of the second oxide layer is etched that corresponds to a sensing cavity, as described in FIG. 8. The etching exposes the bottom electrode. At step 1970, another substrate is bonded, e.g., fusion bonded, to the second oxide layer of the substrate to enclose the sensing cavity, as described in FIG. 9. A top electrode is disposed within the another substrate and positioned over the bottom electrode. At step 1980, a carrier substrate is removed from the another substrate, as described in FIG. 10. It is appreciated that a portion of the another substrate remaining after the removing positioned over the bottom electrode forms a diaphragm of a sensor. At step 1990, a contact via is formed within the second oxide layer, as described in FIG. 11A. It is appreciated that a channel exposes a portion of the patterned polysilicon layer.

Referring now to FIG. 19B, at step 1991, a venting channel is optionally formed within the another substrate, as described in FIG. 11B. The venting channel exposes the second oxide layer. At step 1992, a metal layer is deposited in the contact via and/or on the another substrate and on the venting channel to seal the venting channel, as described in FIGS. 12A and 12B. At step 1994, a TiN$_x$ layer is deposited on the metal layer within the contact via, as described in FIGS. 13A and 13B. At step 1996, an isolation trench is formed within the second oxide layer, as described in FIGS. 14A and 14B. At step 1997, another passivation layer is deposited over the another substrate, the metal layer, and the isolation trench, as described in FIGS. 15A and 15B. At step 1998, a portion of the another passivation layer is removed from the another substrate that corresponds to a diaphragm and from a portion of the metal layer that corresponds to a bond pad, as described in FIGS. 16A and 16B. At step 1999, a TiN$_x$ layer that covers the bond pad is removed, as described in FIGS. 17A and 17B.

It is appreciated that the polysilicon layers form the electrodes for sensing a stimuli, e.g., pressure, and change capacitance in response to a stimuli. Moreover, the polysilicon layer(s) form routing for conducting electrical signals. Moreover, as described above a new pressure sensor design, e.g., sensing membrane and electrodes, with high environment stability is formed. Using polysilicon to form the sensing membrane, as well as electrode and routing, provides better TCO matching and higher thermal budget by using fewer metal layers, as an example. It is appreciated that in some embodiments, fewer metal layers, e.g., only one metal layer, are kept in the end of process for pad connection, thereby decreasing the amount of metal layer usage, as described above. Moreover, using polysilicon instead of metal for the electrode achieves higher annealing because polysilicon does not melt unlike metal. Use of polysilicon reduced the hillock effect. In addition, polysilicon membrane is thin and small in size, thus providing better mechanical stability to prevent membrane stiction as well as reducing gravity sensitivity.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   depositing a passivation layer on a substrate;
   depositing and patterning a first polysilicon layer on the passivation layer;
   depositing and patterning a first oxide layer on the first polysilicon layer to form a patterned first oxide layer;
   depositing and patterning a second polysilicon layer on the patterned first oxide layer, wherein at least one portion of the second polysilicon layer directly contacts at least a portion of the first polysilicon layer, and wherein a portion of the patterned second polysilicon layer corresponds to a bottom electrode;
   depositing a second oxide layer on the patterned second polysilicon layer and further on an exposed portion of the patterned first oxide layer;
   etching a portion of the second oxide layer corresponding to a sensing cavity, wherein the etching exposes the bottom electrode; and
   fusion bonding another substrate to the second oxide layer to enclose the sensing cavity, wherein a top electrode is disposed within the another substrate and wherein the top electrode is positioned over the bottom electrode.

2. The method of claim 1, wherein the passivation layer is an oxide layer.

3. The method of claim 1, wherein the passivation layer comprises a high-density plasma (HDP) oxide.

4. The method of claim 1, wherein the first oxide layer is an oxide, nitride, oxide layer.

5. The method of claim 1, wherein the first oxide layer is an oxide, silicon nitride, oxide layer.

6. The method of claim 1 further comprising removing a carrier substrate from the another substrate, wherein a portion of the another substrate remaining after the removing positioned over the bottom electrode forms a diaphragm of a sensor.

7. The method of claim 1 further comprising forming a contact via within the second oxide layer, wherein a channel exposes a portion of the patterned polysilicon layer.

8. The method of claim 7 further comprising depositing a metal layer in the contact via.

9. The method of claim 8 further comprising depositing a TiN$_x$ layer on the metal layer within the contact via.

10. The method of claim 9 further comprising forming an isolation trench within the second oxide layer.

11. The method of claim 10 further comprising depositing another passivation layer over the another substrate, the metal layer, and the isolation trench.

12. The method of claim 11 further comprising removing a portion of the another passivation layer from the another substrate that corresponds to a diaphragm and further from a portion of the metal layer that corresponds to a bond pad.

13. The method of claim 12 further comprising removing a TiN$_x$ that covers the bond pad.

14. The method of claim 1 further comprising forming a venting channel within the another substrate, wherein the venting channel exposes the second oxide layer.

15. The method of claim 14 further comprising depositing a metal layer on the another substrate and further on the venting channel to seal the venting channel.

16. A device comprising:
   a substrate;
   a passivation layer formed over the substrate;
   a first polysilicon layer formed on the passivation layer;
   a first oxide layer formed on the first polysilicon layer;
   a second polysilicon layer formed on the first oxide layer, wherein at least one portion of the second polysilicon layer directly contacts at least a portion of the first polysilicon layer, and wherein a portion of the patterned second polysilicon layer corresponds to a bottom electrode;
   a second oxide layer formed on the first oxide layer; and
   another substrate bonded to the second oxide layer, wherein the another substrate and a portion of the second oxide layer and the first oxide layer enclose a sensing cavity, wherein a portion of the another substrate forms a diaphragm of a sensor an comprises a top electrode that is positioned over the bottom electrode, and wherein a portion of the second oxide layer forms a sidewall of the enclosed sensing cavity.

17. The device of claim 16 further comprising a contact via opening formed within the another substrate and over the second oxide layer, wherein a metal layer is deposited on the contact via.

18. The device of claim 17, wherein a $TiN_x$ layer is deposited on the metal layer.

19. The device of claim 17, wherein a passivation layer is formed over the metal layer.

20. The device of claim 17, wherein the passivation layer comprises $SiN_x$ and wherein the $SiN_x$ layer is formed directly on the $TiN_x$ layer.

21. The device of claim 16 further comprising a vent hole formed within the another substrate and over the second oxide layer.

22. The device of claim 21, wherein a metal layer seals the vent hole.

23. The device of claim 22, wherein a $TiN_x$ is formed over the metal layer.

24. The device of claim 22, wherein an $SiN_x$ layer is formed over the metal layer.

25. The device of claim 24, wherein the $SiN_x$ layer is formed directly on a $TiN_x$ layer that is formed over the metal layer.

26. The device of claim 16 further comprising an isolation trench formed within another substrate and over the second oxide layer, wherein the isolation trench isolates a metal layer of a bond pad that is formed over the another substrate from other metal layers.

27. The device of claim 26, wherein an $SiN_x$ layer is formed over the isolation trench.

* * * * *

UNITED STATES PATENT AND TRADEMARK OFFICE
CERTIFICATE OF CORRECTION

| | | |
|---|---|---|
| PATENT NO. | : 12,139,398 B2 | Page 1 of 1 |
| APPLICATION NO. | : 17/950007 | |
| DATED | : November 12, 2024 | |
| INVENTOR(S) | : Weng Shen Su et al. | |

It is certified that error appears in the above-identified patent and that said Letters Patent is hereby corrected as shown below:

On the Title Page

Item (72):
Please delete "(72) Inventor CHung-Hsien Lin, Hsinchu (TW)"
And replace with (72) Inventor Chung-Hsien Lin, Hsinchu (TW)

Signed and Sealed this
Thirty-first Day of December, 2024

Derrick Brent
*Acting Director of the United States Patent and Trademark Office*